(12) United States Patent
Isii et al.

(10) Patent No.: US 9,343,308 B2
(45) Date of Patent: May 17, 2016

(54) METHOD FOR TRIMMING CARBON-CONTAINING FILM AT REDUCED TRIMMING RATE

(71) Applicant: ASM IP Holding B.V., Almere (NL)

(72) Inventors: Yoshihiro Isii, Isehara (JP); Ryu Nakano, Sagamihara (JP); Naoki Inoue, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/065,114

(22) Filed: Oct. 28, 2013

(65) Prior Publication Data

US 2015/0118846 A1   Apr. 30, 2015

(51) Int. Cl.
*H01L 21/311*  (2006.01)
*H01L 21/027*  (2006.01)
*H01L 21/033*  (2006.01)
*H01J 37/32*  (2006.01)

(52) U.S. Cl.
CPC ....... *H01L 21/0273* (2013.01); *H01J 37/32091* (2013.01); *H01J 37/32146* (2013.01); *H01L 21/0337* (2013.01); *H01L 21/31138* (2013.01)

(58) Field of Classification Search
CPC ............. H01L 21/31138; H01L 21/0273; H01L 21/0338; H01L 21/31144; H01L 21/32139; H01L 21/0337; H01L 21/3088; H01L 21/0271; H01L 21/0276; H01L 21/033; H01L 21/3065; H01L 21/308; H01L 21/3086; H01J 2237/334; H01J 37/32137; H01J 37/32192
USPC ......... 438/725, 710, 696, 703, 714, 735, 737; 216/67, 58, 41, 49, 69; 257/E21.256, 257/E21.035, E21.311, E21.492
See application file for complete search history.

(56) References Cited

U.S. PATENT DOCUMENTS

| | | | |
|---|---|---|---|
| 6,716,571 B2 * | 4/2004 | Gabriel | H01L 21/28123 216/48 |
| 6,864,041 B2 * | 3/2005 | Brown | G03F 7/40 216/49 |
| 7,354,847 B2 * | 4/2008 | Chan et al. | 438/587 |
| 8,252,691 B2 | 8/2012 | Beynet et al. | |
| 2004/0209477 A1 * | 10/2004 | Buxbaum et al. | 438/710 |
| 2005/0064719 A1 * | 3/2005 | Liu | G03F 7/40 438/725 |
| 2006/0205223 A1 * | 9/2006 | Smayling | 438/725 |
| 2009/0286400 A1 * | 11/2009 | Heo et al. | 438/694 |
| 2010/0140221 A1 * | 6/2010 | Kikuchi | 216/67 |
| 2011/0256727 A1 * | 10/2011 | Beynet et al. | 438/703 |
| 2012/0103939 A1 * | 5/2012 | Wu et al. | 216/70 |
| 2012/0225561 A1 * | 9/2012 | Watanabe | H01J 37/32091 438/710 |
| 2014/0062304 A1 * | 3/2014 | Nakano et al. | 315/111.21 |
| 2014/0127907 A1 * | 5/2014 | Yang | 438/694 |
| 2014/0363980 A1 * | 12/2014 | Kawamata et al. | 438/723 |
| 2014/0367043 A1 * | 12/2014 | Bishara et al. | 156/345.28 |

* cited by examiner

*Primary Examiner* — Nadine Norton
*Assistant Examiner* — Christopher Remavege
(74) *Attorney, Agent, or Firm* — Snell & Wilmer LLP

(57) ABSTRACT

A method for trimming a carbon-containing film includes: (i) providing a substrate having a carbon-containing film formed thereon; (ii) supplying a trimming gas and a rare gas to the reaction space, which trimming gas includes an oxygen-containing gas; and (iii) applying RF power between the electrodes to generate a plasma using the trimming gas and the rare gas and to thereby trim the carbon-containing film while controlling a trimming rate at 55 nm/min or less as a function of at least one parameter selected from the group consisting of a flow rate of an oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed.

19 Claims, 12 Drawing Sheets

Fig. 18

| | | | | | |
|---|---|---|---|---|---|
| O2 / DCM | [sccm] | 6000 | 1000 | 1000 | 1000 |
| N2 / DCM | [sccm] | 0 | 2000 | 4000 | 6000 |
| N2/O2 ratio | | 0 | 2 | 4 | 6 |
| RF miss ignition/Plasma unstable [%] | | 0 | 0 | 0 | 0 |
| ee5mm | Thick Ave. [nm] | 24.2 | 16.7 | 14.4 | 12.3 |
| | E/R [nm/min] | 48.4 | 33.5 | 28.7 | 24.6 |
| | ± % | 2.26 | 1.66 | 1.12 | 2.10 |
| | Range | 1.09 | 0.56 | 0.32 | 0.52 |
| | 1Sigma% | 1.27 | 0.62 | 0.59 | 0.85 |

Fig. 19

| | | | | | |
|---|---|---|---|---|---|
| O2 / DCM | [sccm] | 6000 | 6000 | 6000 | 6000 |
| N2 / DCM | [sccm] | 0 | 0 | 0 | 0 |
| Pulse Plasma | Frequency [Hz] | 5000 | 5000 | 5000 | [N.A] |
| | Duty [%] | 25 | 50 | 75 | 100 |
| RF miss ignition/Plasma unstable [%] | | 0 | 0 | 0 | 0 |
| ee5mm | Thick Ave. [nm] | 11.7 | 15.6 | 20.0 | 24.2 |
| | E/R [nm/min] | 23.4 | 31.2 | 40.1 | 48.4 |
| | ± % | 2.05 | 1.54 | 2.22 | 2.26 |
| | Range | 0.48 | 0.48 | 0.89 | 1.09 |
| | 1Sigma% | 1.22 | 0.62 | 1.20 | 1.27 |

METHOD FOR TRIMMING CARBON-CONTAINING FILM AT REDUCED TRIMMING RATE

BACKGROUND OF THE INVENTION

1. Field of the Invention

The present invention generally relates to a method for trimming a carbon-containing film such as a photoresist at a reduced trimming speed, for spacer-defined double patterning (SDDP), for example.

2. Description of the Related Art

In semiconductor manufacturing processes, fine patterns for circuits, for example, are formed on a semiconductor wafer by etching such as plasma-assisted etching. Recently, formation of finer patterns has progressed by using spacer technology. As an example of such technology, spacer-defined double patterning (SDDP) is explained below. In the SDDP process, patterns are formed as core materials using photoresist or spin-on-carbon (SOC) at intervals which correspond to resolution limit, and then sidewall spacers are formed on sidewalls of the core materials. Thereafter, the core materials are removed while maintaining the sidewall spacers, and the remaining sidewall spacers are used as masks for etching an underlying layer. With this technology, because a distance between the spacers is smaller than a width of the sacrificing film such as photoresist, fine patterns can be formed in the underlying layer, which have a width narrower than the resolution limit.

In order to precisely control the critical dimension (CD), dimension control of the core materials is required, and for this purpose, trimming technology using plasma treatment, for example, is available for removing a portion of the core materials. For precise trimming, lowering trimming rate is essential so that the yield of precise spacers can be increased. In general, trimming rate can be reduced by reducing RF power applied for trimming. However, when RF power is too low, problems occur, e.g., generation of plasma becomes unstable, and in-plane plasma distribution becomes uneven, resulting in non-uniform in-plane trimming rate.

As an attempt for improving throughput and production economy, it is reported that formation of sidewall spacers and trimming are performed in the same process chamber. However, because optimal hardware required for these two processes is different, optimization of process conditions for the processes is a significant problem.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments of the present invention which resolve at least one of the problems, various methods to effectively reduce trimming rate are provided. In some embodiments, nitrogen gas is added to a trimming gas, and/or RF power is switched on and off at high speed to form a pulse train of RF power, thereby reducing trimming rate while improving effective process margin of plasma generation and in-plane uniformity of trimming rate. In some embodiments, trimming rate can be reduced to 60 nm/min or less, preferably 55 nm/min or less, more preferably 50 nm/min or less, without plasma ignition failure or other defects.

In some embodiments, a method for trimming a carbon-containing film comprises: (i) providing a substrate having a carbon-containing film formed thereon in a reaction space wherein the substrate is placed between electrodes; (ii) supplying a trimming gas and a rare gas to the reaction space, said trimming gas comprising an oxygen-containing gas; and (iii) applying RF power between the electrodes to generate a plasma using the trimming gas and the rare gas in the reaction space and to thereby trim the carbon-containing film while controlling a trimming rate at 55 nm/min or less as a function of at least one parameter selected from the group consisting of a flow rate of the oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed. Two or more of the parameters can be used in combination to achieve the desired trimming rate.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 18 illustrates results of changing trimming gas compositions according to an embodiment of the present invention.

FIG. 19 illustrates results of changing duty cycle of RF power according to an embodiment of the present invention.

DETAILED DESCRIPTION OF EMBODIMENTS

Figure 1:
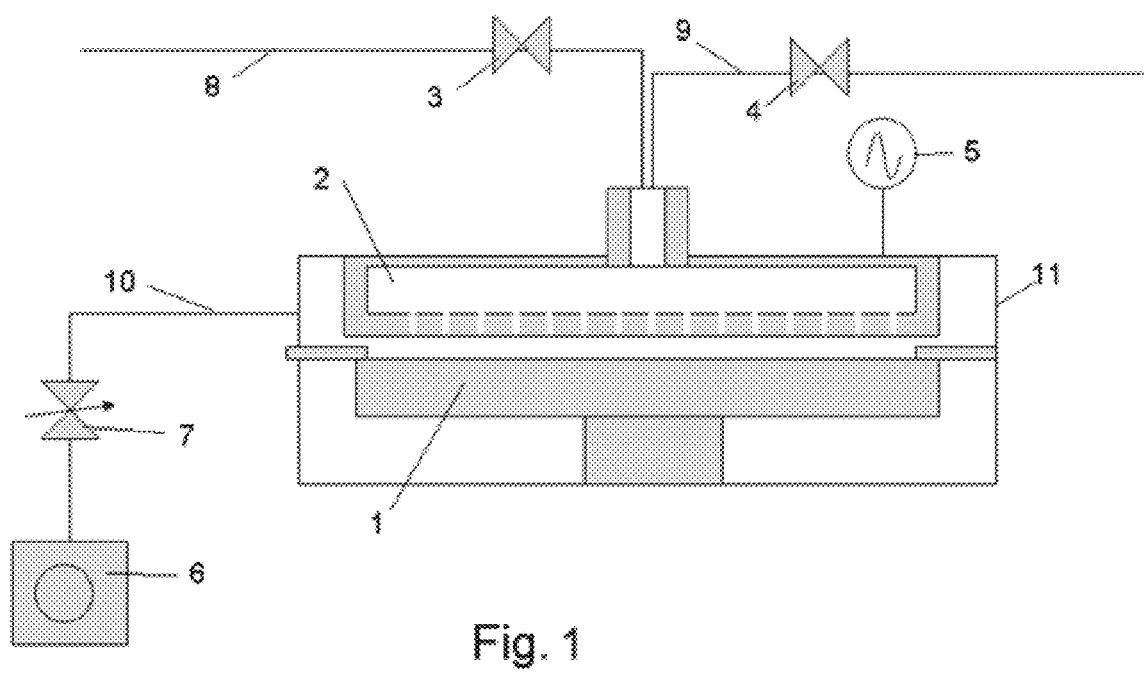
FIG. 1 is a schematic view of a plasma processing apparatus usable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a trimming gas and a rare gas. The trimming gas includes one or more gases, one of which is an oxygen-containing gas. The trimming gas and the rare gas can be introduced as a mixed gas or separately to a reaction space. The trimming gas can be introduced with a carrier gas such as a rare gas. A gas other than the trimming gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In this disclosure, any defined meanings do not necessarily exclude ordinary and customary meanings in some embodiments.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

As described above, in some embodiments, a method for trimming a carbon-containing film comprises: (i) providing a substrate having a carbon-containing film formed thereon in a reaction space wherein the substrate is placed between electrodes; (ii) supplying a trimming gas and a rare gas to the reaction space, said trimming gas comprising an oxygen-containing gas; and (iii) applying RF power between the electrodes to generate a plasma using the trimming gas and the rare gas in the reaction space and to thereby trim the carbon-containing film while controlling a trimming rate at 55 nm/min or less as a function of at least one parameter selected from the group consisting of a flow rate of the oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed.

The trimming rate can be defined as a rate of a reduction of thickness of a film formed on a top surface of a patterned substrate, which rate corresponds substantially to a rate of a reduction of a film formed on a sidewall of the patterned substrate for anisotropic trimming, provided that sidewalls facing each other are effectively apart from each other (if the walls are too close, a plasma may not reach a lower part of the recess). If the trimming rate of a film formed on the sidewall is substantially different from the trimming rate of a film formed on the top surface, the "trimming rate" for the template refers to the trimming rate of the film formed on the sidewall.

In some embodiments, the carbon-containing film is a patterned photoresist. The photoresist may be made of a material selected from the group consisting of methacrylate polymer, acrylate polymer, norbornene polymer, or vinyl-styrene polymer obtained by using fluoroalcohol, aromatic or strong acid monomers. In some embodiments, the carbon-containing film is not limited to photoresist, but includes spin-on-carbon (SOC) material, and carbon-containing film produced by CVD or PVD.

In some embodiments, the oxygen-containing gas is a gas containing oxygen in its molecule, which is at least one selected from the group consisting of $O_2$, $O_3$, NO, $N_2O$, $NO_2$, $CO_2$, etc. These gases can be excited in a plasma generated by RF power to trim the carbon-containing film. In some embodiments, the rare gas is at least one selected from the group consisting of Ar, He, Xe, Kr, etc. In some embodiments, the nitrogen-containing gas is at least one selected from the group consisting of $N_2$, $NH_3$, etc. The trimming gas may be free of halogen.

The trimming rate can be measured using a bulk film; however, since the trimming may be conducted anisotropically, a patterned carbon-containing film having sidewalls and top surfaces is expected to be trimmed equally substantially in all directions.

In some embodiments, in order to reduce the trimming rate to 55 nm/min or less, at least one parameter is controlled, which is selected from the group consisting of a flow rate of the oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed, while maintaining the other parameters unchanged. For example, when the trimming rate is over 55 nm/min under certain conditions, in order to reduce the trimming rate to 55 nm/min or less, at least one of the following is performed while maintaining the other parameters unchanged: the flow rate of the oxygen-containing gas is increased; the flow rate of nitrogen-containing gas to be added to the oxygen-containing gas is increased; the pressure in the reaction space is decreased; RF power is decreased; the duty cycle of RF power is decreased; the distance between the electrodes is increased; and the temperature of a susceptor on which the substrate is placed is decreased.

In some embodiments, the at least one parameter is RF power wherein the trimming rate is controlled at 55 nm/min or less by controlling RF power applied between the electrodes at less than about 0.113 W per $cm^2$ of the substrate. In some embodiments, RF power applied between the electrodes is more than about 0.071 W per $cm^2$ of the substrate. In some embodiments, RF power may be in a range of 0.05 to 0.15 W per $cm^2$ of the substrate, or in a range of 0.08 to 0.10 W per $cm^2$ of the substrate.

In some embodiments, the at least one parameter is a flow rate of the nitrogen-containing gas to be added to the oxygen-containing gas wherein the trimming rate is controlled at 55 nm/min or less by adding the nitrogen-containing gas to the oxygen-containing gas at a flow rate of more than zero. In some embodiments, the flow rate of the nitrogen-containing gas is higher than the flow rate of the oxygen-containing gas. In some embodiments, the flow rate of the nitrogen-containing gas is about two times to about six times higher than the flow rate of the oxygen-containing gas. In some embodiments, the trimming gas consists of the oxygen-containing gas, nitrogen-containing gas, and rare gas.

In some embodiments, RF power is applied in pulses, and the at least one parameter is a duty cycle of RF power wherein the trimming rate is controlled at 55 nm/min or less by controlling the duty cycle of RF power at less than 100% (e.g., less than 80%, 60%, or 40%), said duty cycle being defined as a ratio between a pulse duration of RF power and a cycle duration of pulses of RF power. In some embodiments, RF power is switched on and off to form a pulse train of RF power, and a frequency of the on and off cycles may be about 100 Hz to about 1,000 Hz, whereby the duty of the cycle can be set at a desired value. In alternative embodiments, RF power has a radio-frequency in hertz in which each cycle has a duty of less than 100%, whereby the duty of the cycle can be set at a desired value. Typically, RF power has a frequency of 13.56 MHz, but can be in a range of 2 MHz to 60 MHz, and can be in combination with RF power having a frequency of less than 2 MHz such as 400 kHz.

In some embodiments, the oxygen-containing gas is $CO_2$, and the at least one parameter is a flow rate of the oxygen-containing gas wherein the trimming rate is controlled at 55 nm/min or less by controlling the flow rate of the oxygen-containing gas at more than 500 sccm, e.g., in a range of 800 sccm to 6,000 sccm, typically 1,000 sccm to 4,000 sccm.

In some embodiments, the oxygen-containing gas is $O_2$, and the at least one parameter is a flow rate of the oxygen-containing gas wherein the trimming rate is controlled at 55 nm/min or less by controlling the flow rate of the oxygen-containing gas at more than 1,000 sccm, e.g., in a range of 2,000 sccm to 6,000 sccm.

In some embodiments, the at least one parameter is pressure in the reaction space wherein the trimming rate is controlled at 55 nm/min or less by controlling the pressure at less than 300 Pa, e.g., in a range of 100 Pa to 250 Pa.

In some embodiments, the at least one parameter is the gap between the electrodes wherein the trimming rate is controlled at 55 nm/min or less by controlling the gap at at least about 10 mm, e.g., in a range of 10 cm to 20 mm.

In some embodiments, the at least one parameter is the temperature of the susceptor wherein the trimming rate is controlled at 55 nm/min or less by controlling the temperature at lower than 85° C., e.g., in a range of 40° C. to 80° C.

For example, from the conditions where the trimming rate is over 55 nm/min, four parameters which are the oxygen flow rate, the gap between the electrodes, RF power, and the chamber pressure can be adjusted to about 6,000 sccm, about 13 mm, 60 W (for a 300-mm wafer), and about 200 Pa, respectively, so that the trimming rate can be reduced to 55 nm/min or less without degrading trim uniformity and plasma ignitability.

In some embodiments, the method further comprises, prior to step (ii): (a) supplying a rare gas to the reaction space; and (b) applying RF power between the electrodes to generate a plasma using the rare gas, said RF power being higher than the RF power applied in step (iii), followed by step (ii) without stopping application of RF power. The above embodiments are effective to stabilize plasma ignition, where RF power is controlled at a low value so as to reduce the trimming rate.

In some embodiments, the RF power applied in step (b) is at least about 0.141 W per $cm^2$ of the substrate, e.g., in a range of about 0.15 to 0.25 W per $cm^2$ of the substrate, which may be twice or more higher than the RF power in step (iii).

In some embodiments, the method further comprises, prior to step (b), evacuating a gas line through which the oxygen-containing gas flows to the reaction space. The above embodiments are effective to improve wafer-to-wafer uniformity, by removing trimming gas remaining inside the trimming gas line before the trimming step starts.

In some embodiments, the method further comprises, after step (b) but before step (ii), applying RF power between the electrodes at a power which is between the RF power applied in step (b) and the RF power applied in step (iii). The above embodiments are effective to inhibit delamination or peeling of a spacer material from the core material such as photoresist. In some embodiments, a duration of applying RF power between steps (b) and (ii) is about 12 seconds or less, e.g., in a range of 0.5 seconds to 10 seconds.

In some embodiments, the method further comprises, prior to step (ii), pre-baking the carbon-containing film at a susceptor temperature which is higher than that in step (iii). In some embodiments, the susceptor temperature is about 10° C. lower than the upper limit of heat resistant temperature of photoresist, e.g., in a range of about 80° C. to about 120° C., and a duration of the pre-baking is 10 seconds to 100 seconds, typically 30 seconds to 90 seconds. By conducting the pre-baking, volatile components can be removed from the core material before depositing a spacer material thereon.

In some embodiments, the pre-baking can be conducted after completion of the trimming, so that volatile components can be removed from a surface of the core material which is newly exposed by the trimming, before depositing a spacer material thereon. In some embodiments, the susceptor is equipped with a cooling system so that after the pre-baking, the susceptor temperature can be reduced to that for trimming which is lower than the temperature for pre-baking.

In some embodiments, the method further comprises, after step (iii), depositing a silicon oxide film on the trimmed patterned core material in the reaction space, wherein the susceptor temperature can be adjusted differently for pre-baking, trimming, and deposition. By this, pre-baking, trimming, and deposition can be continuously conducted in the same reaction chamber. In the above, "continuously" refers to without breaking a vacuum, without interruption as a timeline, or immediately thereafter in some embodiments.

As examples, embodiments will be explained below with reference to the drawings.

Figure 2A:
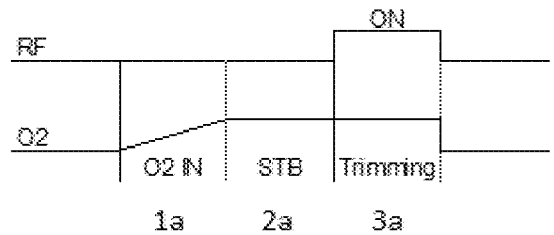
FIG. 2A shows process steps of a plasma-processing method for trimming a photoresist according to an embodiment of the present invention.

FIG. 2A shows process steps of a plasma-processing method for trimming a core material according to an embodiment of the present invention, where a plasma is generated after stabilizing gas and pressure at given conditions. In this drawing (also in FIGS. 2B, 2C, 3, and 4), "O2" represents a trimming gas, and is not intended to limit this figure to an embodiment where the trimming gas is $O_2$. Further, although the drawings (FIGS. 2A, 2B, 2C, and 3) do not show it, a rare gas such as Ar flows continuously through the reaction space. In FIG. 2A, in step 1a, oxygen gas begins flowing into the reaction chamber, wherein typically, the flow rate is gradually increased so that extinction of plasma, unstable flow control, and non-uniform flow between chambers of a dual reactor can be avoided. In step 2a, after the flow rate of oxygen reaches a set value, oxygen is kept flowing for a given time period for further stabilization. In step 3a, while maintaining the oxygen flow, RF power is applied between the electrodes to conduct trimming of a photoresist. In some embodiments, a duration of step 1a is in a range of 1 to 30 seconds (typically 3 to 20 seconds), a duration of step 2a is in a range of 1 to 60 seconds (typically 5 to 20 seconds), and a duration of step 3a is in a range of 0.2 to 60 seconds (typically 1 to 30 seconds). In this sequence, when RF power is low, extinction of plasma may occur.

Figure 2B:
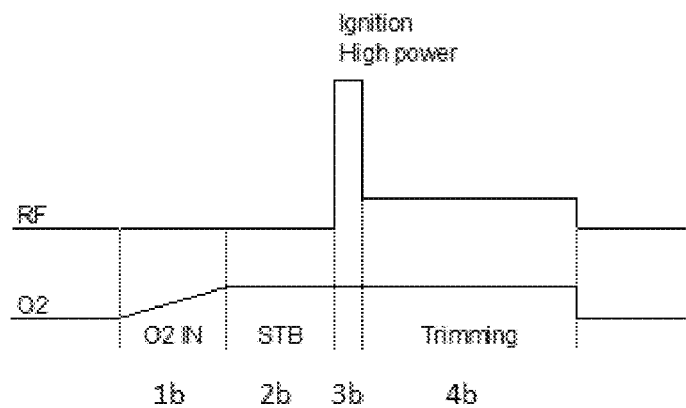
FIG. 2B shows process steps of a plasma-processing method for trimming a photoresist according to another embodiment of the present invention.

FIG. 2B shows process steps of a plasma-processing method for trimming a core material according to another embodiment of the present invention, where steps 1b, 2b, and 4b correspond to steps 1a, 2a, and 3a of FIG. 2A. In this sequence, in step 3b, after step 2b (stabilization step), RF power having a higher power than that for trimming in step 4b is applied, so that extinction of plasma can be avoided. However, since when RF power is applied in step 3b, oxygen gas is already present in the reaction space, the trimming rate becomes higher.

Figure 2C:
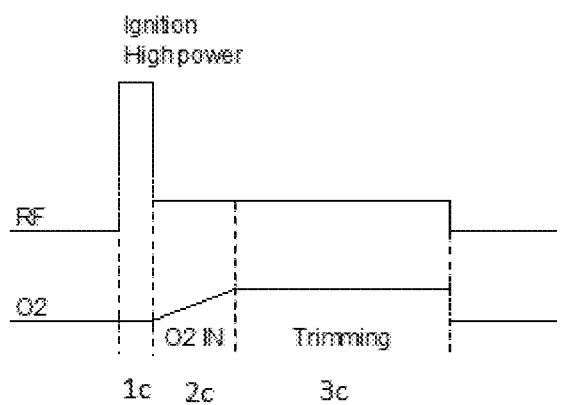
FIG. 2C shows process steps of a plasma-processing method for trimming a photoresist according to still another embodiment of the present invention.

FIG. 2C shows process steps of a plasma-processing method for trimming a photoresist according to still another embodiment of the present invention, where RF power (spike RF power) having a higher power than that for trimming in step 3c is applied in step 1c where no oxygen gas is present in the reaction space, so that increase of trimming rate can be prevented, while improving ignitability. In step 1c, a rare gas flows through the reaction space without oxygen gas (which represents trimming gas), so that plasma ignition can stably be performed with spike RF power. Step 2c corresponds to step 1a in FIG. 2A except that oxygen gas begins flowing into the reaction space while RF power is applied to the reaction space. Step 3c corresponds to step 3a in FIG. 2A. In some embodiments, a duration of step 1c is in a range of 0.1 to 30 seconds (typically 0.2 to 15 seconds, preferably about 0.5 seconds), a duration of step 2c is in a range of 0.5 to 30 seconds (typically 1 to 20 seconds), and a duration of step 3c is in a range of 1 to 60 seconds (typically 1 to 30 seconds). The spike RF power may be about 0.212 $W/cm^2$ of the substrate ±50%. The RF power applied in step 2c may be the same as or higher than the RF power applied in step 3c, but lower than the RF power applied in step 1c.

In the above, oxygen gas represents trimming gas, and any gas other than oxygen can be used in the same manner to exhibit the same effect.

Figure 3:
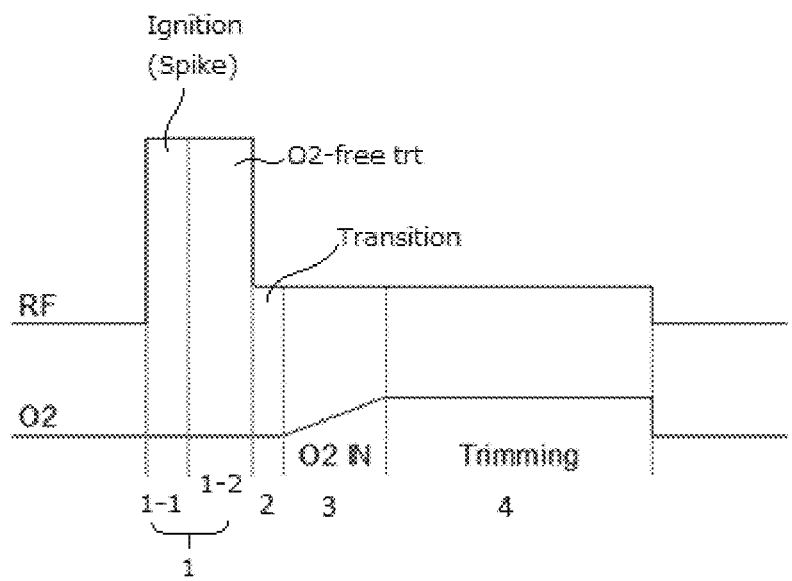
FIG. 3 shows process steps of a plasma-processing method for trimming a photoresist according to yet another embodiment of the present invention.

FIG. 3 shows process steps of a plasma-processing method for trimming a photoresist according to yet another embodiment of the present invention. In this sequence, steps 1-1, 3, and 4 correspond to steps 1c, 2c, and 3c in FIG. 2C, and step 1-2 and step 2 are additionally conducted, where RF power is applied to the reaction space containing a rare gas but no oxygen gas. As in FIG. 2C, by conduction step 1-1 ("Ignition"), ignitability can be improved while preventing increase of trimming rate. Step 1-2 is extended step 1-1 to perform surface treatment in an oxygen-free atmosphere ("O2-free trt"). By conducting step 1-2, in-plane trimming uniformity and adhesion between the core material and the spacer can significantly be improved. This may be because a plasma in step 1-2 activates a surface of the core material and also removes volatile components. In some embodiments, a duration of the sum of steps 1-1 and 1-2 is in a range of 0.5 to 30 seconds or 0.5 to 15 seconds (typically 1 to 12 seconds). The duration can vary depending on the type of the core material and the desired CD distribution. Also, the duration can be adjusted for each wafer. Step 1-2 for the purpose of improving ignitability and step 1-1 for the purpose of improving uniformity and adhesion can be conducted in the same manner or differently, where The RF power applied in step 1-2 may be about 0.212 W/cm$^2$ of the substrate ±50% or may be the same as or lower than the RF power applied in step 1-1, and may be the same as or higher than the RF power applied in step 3. Steps 1-1 and 1-2 constitute step 1 (collectively referred to as "oxygen-free RF power").

Step 2 is conducted as transition between spike RF power application (step 1) and RF power application for trimming (step 3) so as to reduce power from spike RF power to RF power for trimming in an oxygen-free atmosphere, and RF power in step 2 may be referred as "transition RF power". A duration of step 2 is in a range of 0 to about 1.0 seconds (typically about 0.1 seconds). The RF power can instantly drop from the RF power applied in step 1 to the RF power applied in step 3 or can gradually decrease from the RF power applied in step 1 to the RF power applied in step 3.

Additionally, the preferable pressure in this sequence may be about 200 Pa±50%.

Figure 4:
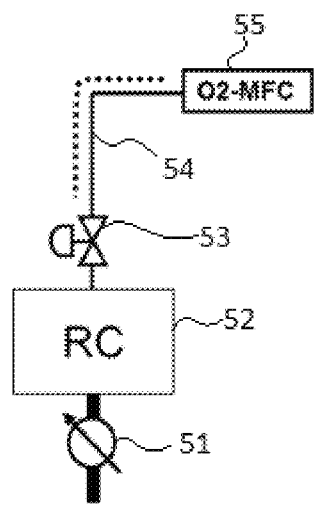
FIG. 4 is a schematic view of a reaction chamber with an oxygen gas supply system and a vacuum system according to an embodiment of the present invention.

FIG. 4 is a schematic view of a reaction chamber with an oxygen gas supply system and a vacuum system according to an embodiment of the present invention. In this embodiment, a reaction chamber (RC) 52 has an exhaust port with a valve 51 for taking gas out of the reaction chamber. An oxygen gas (which represents trimming gas) is introduced to the reaction chamber 52 through an oxygen supply line 54 and a valve 53. The flow rate of oxygen is controlled by a mass flow controller (MFC) 55. This system is effective to stabilize oxygen flow. In the oxygen supply line 54 marked with a broken line, residual oxygen gas which has leaked from the MFC during an idling period of a vacuum device is present and will flow into the reaction chamber when RF power is applied in addition to oxygen gas properly flowing into the reaction chamber. This residual oxygen gas increases trimming rate of the first wafer. The idling period is a period after completion of spacer deposition of previous wafers before starting trimming of core materials of next wafers, where trimming and deposition are conducted as a continuous unit process, and the unit processes are repeated at intervals which correspond to the idling periods. Additionally, when the intervals are long, or a process error occurs, the duration of the intervals changes, resulting in uneven amount of residual gas in the oxygen supply line. By evacuating the reaction chamber 52 including the oxygen supply line 54 by opening the valves 51 and 53 immediately before the trimming step starts in accordance with the sequence illustrated in FIG. 2C or 3, it is possible to equalize the amount of oxygen flowing into the reaction space, thereby reducing wafer-to-wafer variation. In the sequence illustrated in FIGS. 2A and 2B, the above evacuation process is not useful since by the time the trimming starts, oxygen gas flow is already stabilized.

The disclosed system associated with plasma ignition and stabilization of gas flow can be applied to any low-RF power system including a trimming system with a trimming rate of over 55 nm/min. Further, the disclosed embodiments using nitrogen gas as a trimming gas can be applied to trimming processes even when the trimming rate is slightly over 55 nm/min (e.g., 60 nm/min). For example, an embodiment provides a method for trimming a photoresist, comprising: providing a substrate having a carbon-containing film formed thereon in a reaction space; supplying a trimming gas to the reaction space where the substrate is placed, said trimming gas comprising an oxygen-containing gas and a nitrogen-containing gas wherein a flow rate of the nitrogen-containing gas is higher than a flow rate of the oxygen-containing gas; and applying RF power to the trimming gas in the reaction space to generate a plasma using the trimming gas, and to trim the carbon-containing film thereby.

Figure 17:
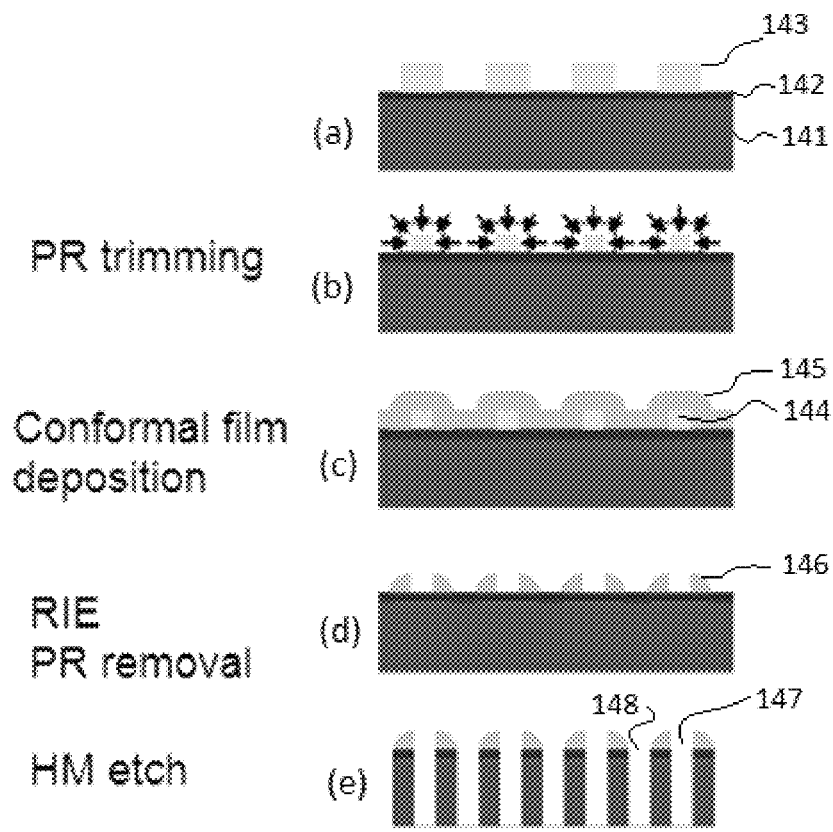
FIG. 17 is a schematic representation illustrating a part of the SDDP sequence of (a) photoresist (PR) patterning, (b) anisotropic PR trimming, (c) spacer layer deposition, (d) isotropic etching of the spacer and removal of the PR, and (e) isotropic etching of the underlying layer according to an embodiment of the present invention.

By using the core material trimmed, spacers can be formed as follows: FIG. 17 is a schematic representation illustrating a part of the SDDP sequence of (a) photoresist (PR) patterning, (b) anisotropic PR trimming, (c) spacer layer deposition, (d) isotropic etching of the spacer and removal of the PR, and (e) isotropic etching of the underlying layer according to an embodiment of the present invention. In (a) of FIG. 17, an organic bottom antireflective coating (BARC) layer 142 is formed on a substrate 141. The BARC layer has high etch selectivity relative to a photoresist (PR). A photoresist material is applied on the BARC layer 142, and prebaked, thereby forming a photoresist film. A pattern circuit area of the photoresist film is then exposed to irradiation, and then developed with a developing liquid, thereby forming a photoresist pattern 143. The photoresist has a widened footing as a result of the patterning. Thus, the photoresist is subjected to anisotropic trimming using a plasma generated in an environment where a gas containing oxygen is introduced, thereby forming a trimmed photoresist 144 in (b) of FIG. 17. Next, a SiO film 145 is formed as a side spacer film on the template in (c) of FIG. 17. Since the SiO film is deposited on the photoresist, the deposition temperature may be, for example, about 150° C. or lower or about 100° C. or lower, depending on the heat resistance of the photoresist and BARC. The top and bottom portions of the side spacer film 145 and the photoresist 144 are then removed (e.g., by reactive-ion etching (RIE)), thereby forming provisional side spacers 146 in (d) of FIG. 17. Thereafter, by using the spacer 146 as a hard mask, isotropic etching is conducted to form trenches 147, 148 in (e) of FIG. 17.

FIG. 1 is a schematic view of an apparatus combining a plasma processing reactor and flow control valves, desirably in conjunction with controls programmed to conduct the sequences described below, which can be used in an embodiment of the present invention. This apparatus comprises a reactor 11 which can be retained in a vacuum state, susceptor 1 with heating/cooling mechanism used to hold a single wafer on top, shower head 2 which provides a mechanism for supplying gas, RF application mechanism 5 that generates a pulse-time-modulated plasma between the shower head and susceptor, precursor gas supply line 8 equipped with an open/close valve 3 connected to the shower head 2, reactant gas supply line 9 equipped with another open/close valve 4, exhaust line 10 used to exhaust the atmosphere inside the reactor 11, and vacuum pump 6 connected after the exhaust line via a pressure control valve 7, among others. Note that a purge gas line (not illustrated) is also connected to the shower head 2 just like the reactant gas supply line 9.

A skilled artisan will appreciate that the apparatus includes one or more controller(s) (not shown) programmed or otherwise configured to cause the deposition and trimming described elsewhere herein to be conducted. The controller(s) are communicated with the various power sources, heating/cooling systems, pumps, robotics and gas flow controllers or valves of the reactor, as will be appreciated by the skilled artisan.

reaction chambers. In Table 1 (and also the other tables), items (1) to (15) represent the following:

(1) RF power for trimming [W] (13.56 MHz)
(2) Oxygen flow rate for trimming [sccm]
(3) Nitrogen or carbon dioxide flow rate for trimming [sccm]
(4) Reaction chamber pressure [Pa]
(5) Distance between electrodes [mm]
(6) Temperature of the substrate [° C.]
(7) Temperature of pre-baking [° C.]
(8) Duration of pre-baking [seconds]
(9) Duration of oxygen-free RF power [seconds]
(10) Oxygen-free RF power [W] (applied in step 1 of FIG. 3)
(11) Duration of oxygen-free transition RF power [seconds]
(12) Oxygen-free transition RF power [W] prior to trimming (applied in step 2 of FIG. 3)
(13) Duty cycle of RF power [%]
(14) Duration of trimming [seconds]
(15) Rare gas flow rate [sccm] (continuous flow)

In the table, "-" represents the process being not conducted. The volume of the interior of the dual chamber reactor was 2,156 cm$^3$ (1,078 cm$^3$×2), and thus, 6,000 sccm, for example, can be calculated as 2.78 sccm/cm$^3$. Also, the wafer had a diameter of 300 mm, and thus, an RF power of 100 W, for example, can be calculated as 0.141 W/cm$^2$ of the wafer surface.

TABLE 1

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 1 | 10 | 6000 | — | 200 | 13 | 75 | — | — | 0.5 | 150 | 0.1 | 10 | — | 8 | Ar: 500 |
| 2 | 20 | 6000 | — | 200 | 13 | 75 | — | — | 0.5 | 150 | 0.1 | 20 | — | 8 | Ar: 500 |
| 3 | 30 | 6000 | — | 200 | 13 | 75 | — | — | 0.5 | 150 | 0.1 | 30 | — | 8 | Ar: 500 |
| 4 | 55 | 6000 | — | 200 | 13 | 75 | — | — | 0.5 | 150 | 0.1 | 55 | — | 8 | Ar: 500 |
| 5 | 80 | 6000 | — | 200 | 13 | 75 | — | — | 0.5 | 150 | 0.1 | 80 | — | 8 | Ar: 500 |
| 6 | 100 | 6000 | — | 200 | 13 | 75 | — | — | 0.5 | 150 | 0.1 | 100 | — | 8 | Ar: 500 |

The present invention will be explained with reference to the following examples which are not intended to limit the present invention.

Examples 1 to 6

Figure 5:
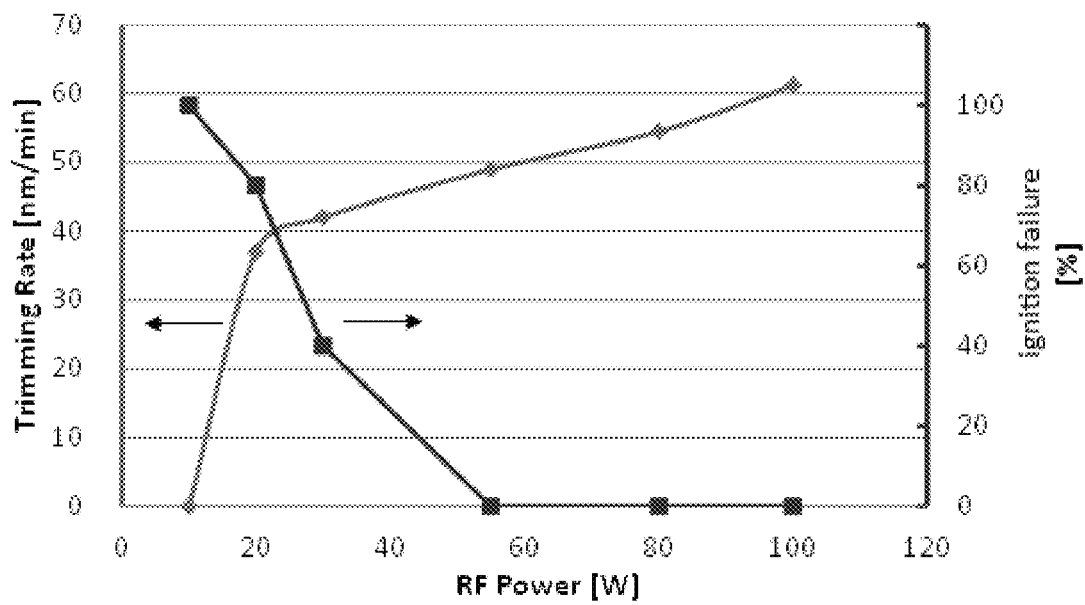
FIG. 5 is a graph showing the relationship between RF power [W] and trimming rate [nm/min] and between RF power [W] and plasma ignition failure [%] according to an embodiment of the present invention (the arrows indicate the corresponding axes).

A 300-mm substrate having a patterned photoresist having an aspect ratio of about 2 and an opening width of about 50 nm was provided. The substrate was subjected to trimming under conditions shown in Table 1 below using the sequence illustrated in FIG. 3 and a plasma-processing apparatus similar to that illustrated in FIG. 1, which was a module having dual The results are shown in FIG. 5. FIG. 5 is a graph showing the relationship between RF power [W] and trimming rate [nm/min] and between RF power [W] and plasma ignition failure [%] according to Examples 1 to 6 (the arrows indicate the corresponding axes). As shown in FIG. 5, in order to reduce the trimming rate to 55 nm/min or lower, RF power had to be reduced to 80 W. However, when RF power was lower than 60 W, the frequency of ignition failure increased, thereby destabilizing the trimming process.

Examples 7 to 10

Examples 7 to 10 were conducted in a manner substantially similar to that in Examples 1 to 6 under conditions shown in Table 2 below.

TABLE 2

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 7 | 60 | 6000 | N2: 0 | 200 | 13 | 75 | — | — | 0.5 | 150 | 0.1 | 60 | — | 8 | Ar: 500 |
| 8 | 60 | 1000 | N2: 2000 | 200 | 13 | 75 | — | — | 0.5 | 150 | 0.1 | 60 | — | 8 | Ar: 500 |
| 9 | 60 | 1000 | N2: 4000 | 200 | 13 | 75 | — | — | 0.5 | 150 | 0.1 | 60 | — | 8 | Ar: 500 |
| 10 | 60 | 1000 | N2: 6000 | 200 | 13 | 75 | — | — | 0.5 | 150 | 0.1 | 60 | — | 8 | Ar: 500 |

Figure 8:
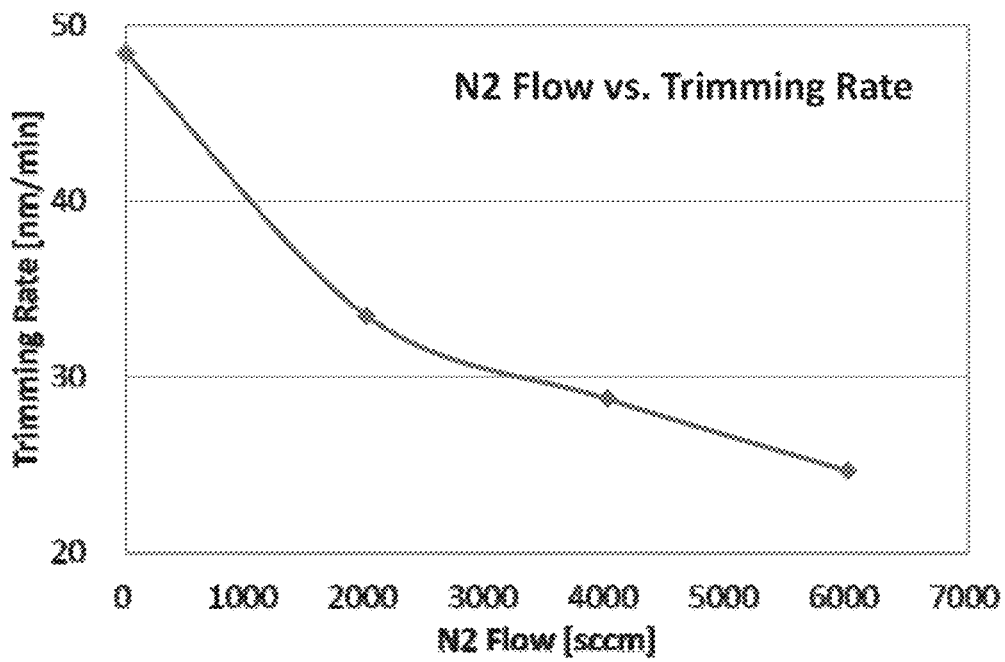
FIG. 8 is a graph showing the relationship between trimming rate [nm/min] and nitrogen flow rate [sccm] according to an embodiment of the present invention.

The results are shown in FIG. 8. FIG. 8 is a graph showing the relationship between trimming rate [nm/min] and nitrogen flow rate [sccm] according to Examples 7 to 10. As shown in FIG. 8, by adding nitrogen gas to oxygen gas as a trimming gas, the trimming rate can be reduced significantly. Further, in-plane trimming uniformity was determined, and the results are shown in FIG. 18. FIG. 18 illustrates results of changing trimming gas compositions according to Examples 7 to 10. In the figure, "Thick.Ave." refers to the average trimmed (reduced) amount in thickness of the film (measured at 49 locations on the surface). "E/R" refers to the trimming rate (etch rate). "± %" refers to a range of the trimmed amount in thickness within which the data of all the substrates fell. "Range" refers to a difference between the maximum and the minimum values of thickness. "1 Sigma %" refers to in-plane uniformity of trimmed amount at 1σ%. "ee5 mm" refers to an area from the outer periphery to 5 mm inside therefrom being excluded from the measurement. As shown in FIG. 18, the addition of nitrogen gas did not increase the frequency of ignition failure, although it reduced the trimming rate, and also the addition of nitrogen gas improved in-plane trimming uniformity.

Examples 11 to 14

Examples 11 to 14 were conducted in a manner substantially similar to that in Examples 1 to 6 under conditions shown in Table 3 below. In these examples, RF power was turned off and on at a cycle of 1/5,000 seconds.

TABLE 3

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 11 | 60 | 6000 | — | 200 | 13 | 75 | — | — | 0.5 | 150 | 0.1 | 60 | 25 | 8 | Ar: 500 |
| 12 | 60 | 6000 | — | 200 | 13 | 75 | — | — | 0.5 | 150 | 0.1 | 60 | 50 | 8 | Ar: 500 |
| 13 | 60 | 6000 | — | 200 | 13 | 75 | — | — | 0.5 | 150 | 0.1 | 60 | 80 | 8 | Ar: 500 |
| 14 | 60 | 6000 | — | 200 | 13 | 75 | — | — | 0.5 | 150 | 0.1 | 60 | 100 | 8 | Ar: 500 |

Figure 9:
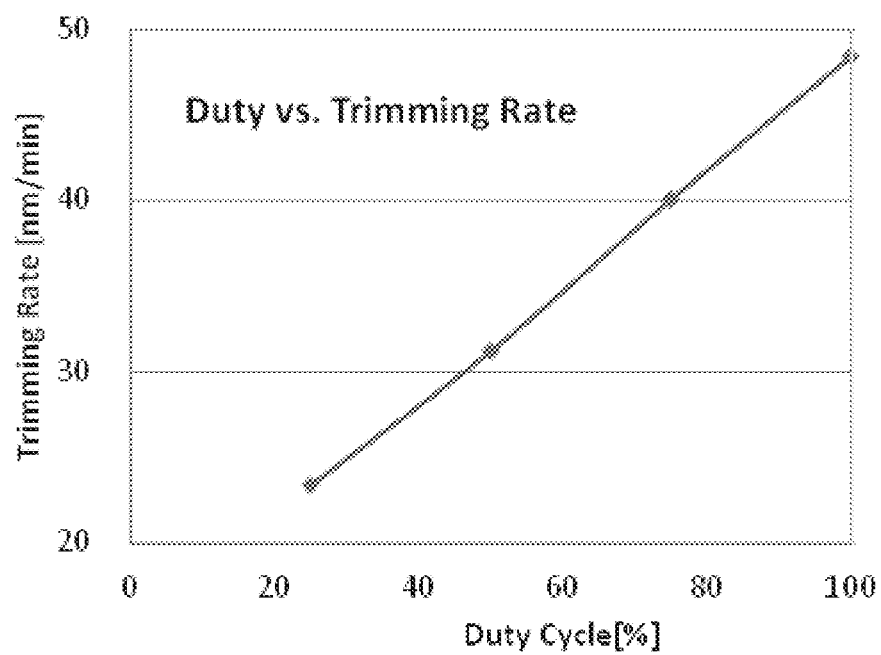
FIG. 9 is a graph showing the relationship between trimming rate [nm/min] and duty cycle of RF power [%] according to an embodiment of the present invention.

The results are shown in FIG. 9. FIG. 9 is a graph showing the relationship between trimming rate [nm/min] and duty cycle of RF power [%] according to Examples 11 to 14. As shown in FIG. 9, when RF power was applied in pulses, by reducing the duty cycle, the trimming rate can be reduced significantly. Further, in-plane trimming uniformity was determined in the same manner as in FIG. 18, and the results are shown in FIG. 19. FIG. 19 illustrates results of changing duty cycles of RF power according to Examples 11 to 14. As shown in FIG. 19, the duty cycle did not affect the frequency of ignition failure, and when the duty cycle was about 50% (typically 40% to 60%), the trimming rate was reduced, and in-plane trimming uniformity was significantly improved.

Examples 15 to 18

Examples 15 to 18 were conducted in a manner substantially similar to that in Examples 1 to 6 under conditions shown in Table 4 below.

TABLE 4

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 15 | 60 | 6000 | — | 200 | 13 | 75 | — | — | 0.5 | 150 | 0.1 | 60 | — | 8 | Ar: 500 |
| 16 | 60 | 1000 | N2: 6000 | 200 | 13 | 75 | — | — | 0.5 | 150 | 0.1 | 60 | — | 8 | Ar: 500 |
| 17 | 60 | 1000 | — | 200 | 13 | 75 | — | — | 0.5 | 150 | 0.1 | 60 | — | 8 | Ar: 6500 |
| 18 | 60 | 1000 | — | 200 | 13 | 75 | — | — | 0.5 | 150 | 0.1 | 60 | — | 8 | Ar: 500 He: 6000 |

The results are shown in Table 5 below.

TABLE 5

| Ex. | Trimming gas | Gas ratio | Trimming rate [nm/min] | Trimming rate ratio relative to that in Ex. 15 |
|---|---|---|---|---|
| 15 | O2 + Ar | 6:0.5- | 31.2 | — |
| 16 | O2 + N2 + Ar | 1:6:0.5 | 18.8 | 60% |
| 17 | O2 + Ar | 1:6.5 | 29.1 | 93% |
| 18 | O2 + He + Ar | 1:6:0.5 | 28.4 | 91% |

As shown in Table 5, when adding nitrogen gas to oxygen gas as a trimming gas, as compared with a rare gas added to oxygen gas, the trimming rate can be reduced significantly, indicating that the reduction of trimming rate by adding nitrogen gas was not attributed by dilution of oxygen gas.

Examples 19 to 24

Examples 19 to 24 were conducted in a manner substantially similar to that in Examples 1 to 6 under conditions shown in Table 6 below.

TABLE 6

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 19 | 50 | — | CO2: 1000 | 200 | 13 | 75 | — | — | 0.5 | 150 | 0.1 | 50 | — | 20 | Ar: 500 |
| 20 | 50 | — | CO2: 1000 | 200 | 13 | 75 | — | — | 0.5 | 150 | 0.1 | 50 | — | 40 | Ar: 500 |
| 21 | 50 | — | CO2: 1000 | 200 | 13 | 75 | — | — | 0.5 | 150 | 0.1 | 50 | — | 60 | Ar: 500 |
| 22 | 50 | 1000 | — | 200 | 13 | 75 | — | — | 0.5 | 150 | 0.1 | 50 | — | 20 | Ar: 500 |
| 23 | 50 | 1000 | — | 200 | 13 | 75 | — | — | 0.5 | 150 | 0.1 | 50 | — | 40 | Ar: 500 |
| 24 | 50 | 1000 | — | 200 | 13 | 75 | — | — | 0.5 | 150 | 0.1 | 50 | — | 60 | Ar: 500 |

Figure 14:
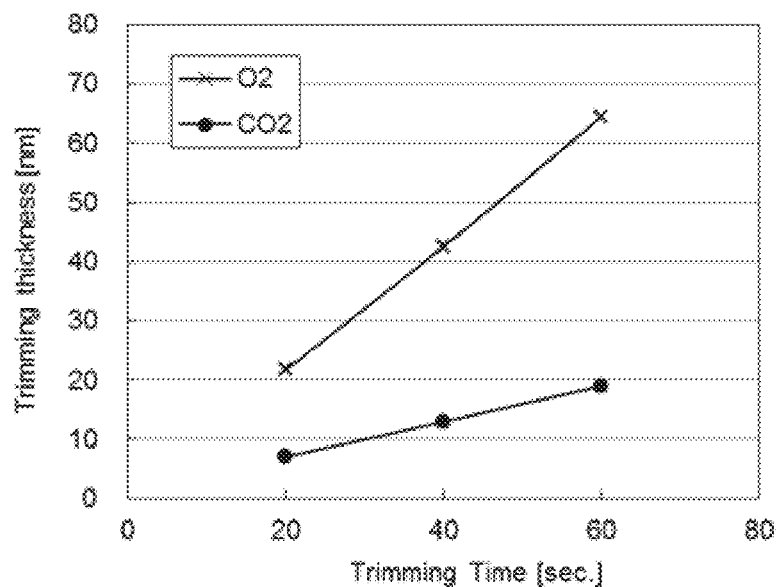
FIG. 14 is a graph showing the relationship between trimmed thickness [nm] and trimming time [sec] when using oxygen (O2) or carbon dioxide (CO2) according to an embodiment of the present invention.

The results are shown in FIG. 14. FIG. 14 is a graph showing the relationship between trimmed thickness [nm] and trimming time [sec] when using oxygen (O2) or carbon dioxide (CO2) according Examples 19 to 24. As shown in FIG. 14, when using carbon dioxide in place of oxygen as a trimming gas, the trimming rate was reduced to about 30% relative to that by oxygen gas.

Examples 25 to 36

Examples 25 to 36 were conducted in a manner substantially similar to that in Examples 1 to 6 under conditions shown in Table 7 below.

TABLE 7

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 25 | 60 | 1000 | — | 200 | 13 | 75 | — | — | 0.5 | 150 | 0.1 | 60 | — | 8 | Ar: 500 |
| 26 | 60 | 3500 | — | 200 | 13 | 75 | — | — | 0.5 | 150 | 0.1 | 60 | — | 8 | Ar: 500 |
| 27 | 60 | 6000 | — | 200 | 13 | 75 | — | — | 0.5 | 150 | 0.1 | 60 | — | 8 | Ar: 500 |
| 28 | 60 | 6000 | — | 200 | 13 | 75 | — | — | 0.5 | 150 | 0.1 | 60 | — | 8 | Ar: 500 |
| 29 | 60 | 6000 | — | 300 | 13 | 75 | — | — | 0.5 | 150 | 0.1 | 60 | — | 8 | Ar: 500 |
| 30 | 60 | 6000 | — | 400 | 13 | 75 | — | — | 0.5 | 150 | 0.1 | 60 | — | 8 | Ar: 500 |
| 31 | 60 | 6000 | — | 200 | 13 | 75 | — | — | 0.5 | 150 | 0.1 | 60 | — | 8 | Ar: 500 |
| 32 | 80 | 6000 | — | 200 | 13 | 75 | — | — | 0.5 | 150 | 0.1 | 80 | — | 8 | Ar: 500 |
| 33 | 100 | 6000 | — | 200 | 13 | 75 | — | — | 0.5 | 150 | 0.1 | 100 | — | 8 | Ar: 500 |
| 34 | 60 | 6000 | — | 200 | 7.5 | 75 | — | — | 0.5 | 150 | 0.1 | 60 | — | 8 | Ar: 500 |
| 35 | 60 | 6000 | — | 200 | 13 | 75 | — | — | 0.5 | 150 | 0.1 | 60 | — | 8 | Ar: 500 |
| 36 | 60 | 6000 | — | 200 | 18 | 75 | — | — | 0.5 | 150 | 0.1 | 60 | — | 8 | Ar: 500 |

Figure 6A:
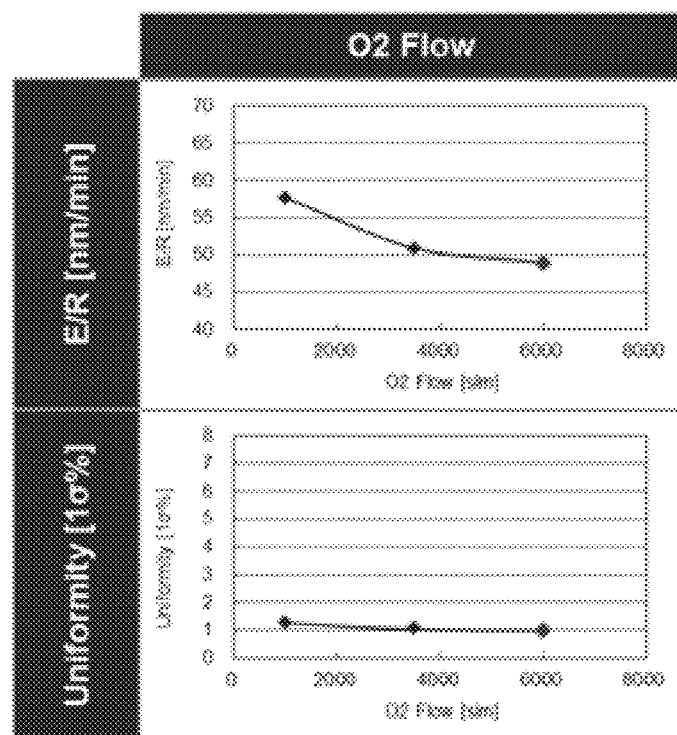
FIG. 6A consists of two graphs wherein the upper graph shows the relationship between etch rate (trimming rate) [nm/min] and oxygen flow rate [sccm], and the lower graph shows the relationship between etch uniformity [1σ %] and oxygen flow rate [sccm] according to an embodiment of the present invention.
Figure 6B:
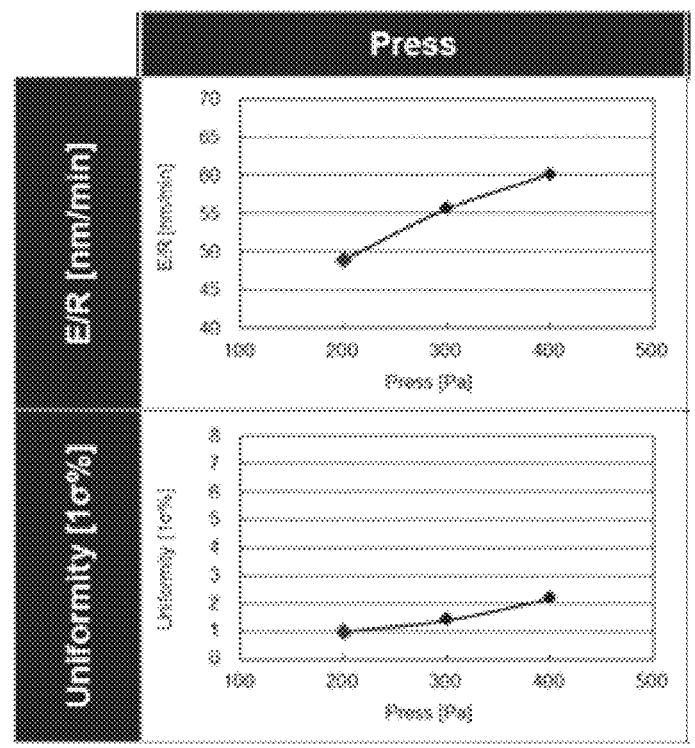
FIG. 6B consists of two graphs wherein the upper graph shows the relationship between etch rate (trimming rate) [nm/min] and chamber pressure [Pa], and the lower graph shows the relationship between etch uniformity [1σ%] and chamber pressure [Pa] according to an embodiment of the present invention.
Figure 6C:
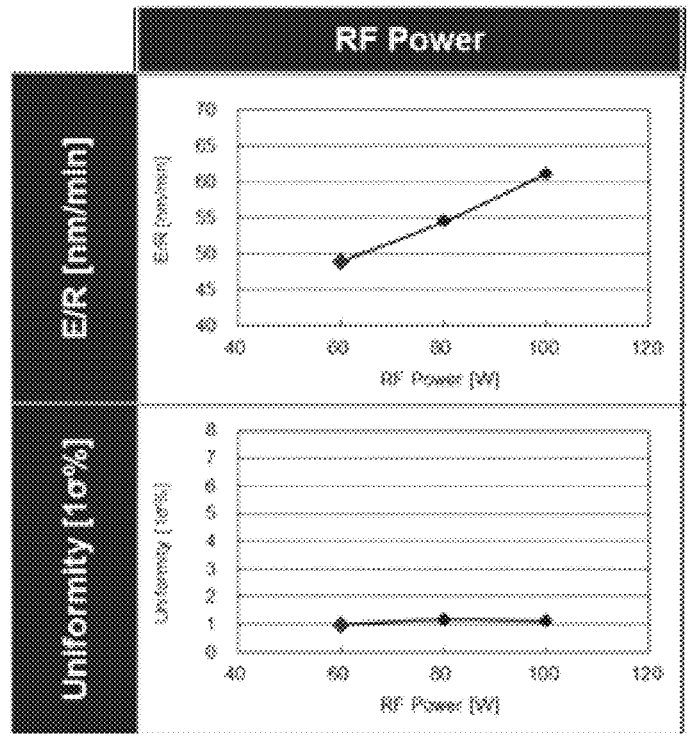
FIG. 6C consists of two graphs wherein the upper graph shows the relationship between etch rate (trimming rate) [nm/min] and RF power [W], and the lower graph shows the relationship between etch uniformity [1σ%] and RF power [W] according to an embodiment of the present invention.
Figure 6D:
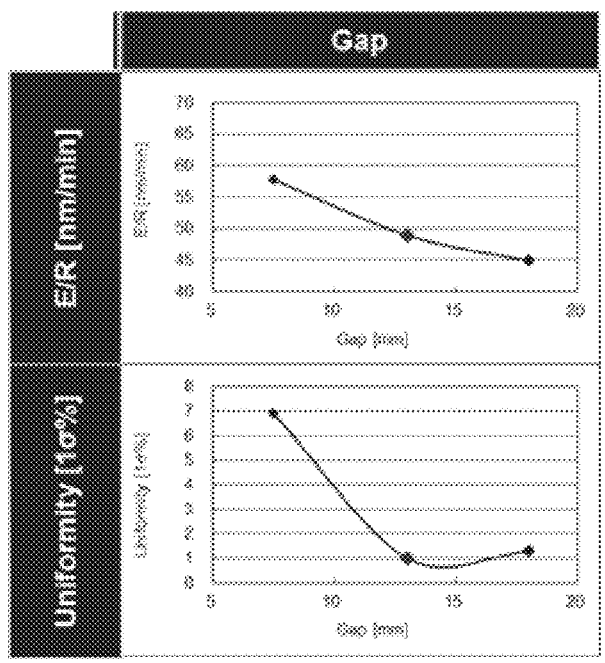
FIG. 6D consists of two graphs wherein the upper graph shows the relationship between etch rate (trimming rate) [nm/min] and gap between electrodes [mm], and the lower graph shows the relationship between etch uniformity [1σ%] and gap between electrodes [mm] according to an embodiment of the present invention.

The results are shown in FIGS. 6A to 6D. FIG. 6A consists of two graphs wherein the upper graph shows the relationship between etch rate (trimming rate) [nm/min] and oxygen flow rate [sccm], and the lower graph shows the relationship between etch uniformity [1σ%] and oxygen flow rate [sccm] according to Examples 25 to 27. FIG. 6B consists of two graphs wherein the upper graph shows the relationship between etch rate (trimming rate) [nm/min] and chamber pressure [Pa], and the lower graph shows the relationship between etch uniformity [1σ%] and chamber pressure [Pa] according to Examples 28 to 30. FIG. 6C consists of two graphs wherein the upper graph shows the relationship between etch rate (trimming rate) [nm/min] and RF power [W], and the lower graph shows the relationship between etch uniformity [1σ%] and RF power [W] according to Examples 31 to 33. FIG. 6D consists of two graphs wherein the upper graph shows the relationship between etch rate (trimming rate) [nm/min] and gap between electrodes [mm], and the lower graph shows the relationship between etch uniformity [1σ %] and gap between electrodes [mm] according to Examples 34 to 36. As shown in FIGS. 6A to 6D, by increasing oxygen flow rate, the trimming rate can be reduced without affecting in-plane trimming uniformity. Particularly, when the oxygen flow rate was about 2,000 sccm or higher, the trimming rate was reduced to 55 nm/min or less (FIG. 6A). On the other hand, when the flow rate is increased, the pressure also is necessarily increased. When the pressure was increased, the trimming rate increased (FIG. 6B). Thus, the oxygen gas flow rate of about 6,000 sccm to about 2,000 sccm was expected to be highly effective. When RF power was decreased, the trimming rate decreased (FIG. 6C). A power of about 60 W to about 80 W is expected to be highly effective.

By increasing the distance between the electrodes, the trimming rate was reduced, and the uniformity was improved (FIG. 6D). However, when the distance between the electrodes was increased, ignition failure rate also increased. Thus, a distance between the electrodes of about 10 mm to about 15 mm is expected to be highly effective.

Examples 37 to 38

Examples 37 to 38 were conducted in a manner substantially similar to that in Examples 1 to 6 under conditions shown in Table 8 below. In these examples, before starting the trimming process illustrated in FIG. 3, the oxygen gas supply line as illustrated in FIG. 4 was evacuated.

TABLE 8

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 37 | 60 | 6000 | — | 200 | 13 | 75 | — | — | 0.5 | 150 | 0.1 | 60 | — | 8 | Ar: 500 |
| 38 | 60 | 6000 | — | 200 | 13 | 75 | — | — | 0.5 | 150 | 0.1 | 60 | — | 8 | Ar: 500 |

Figure 10:
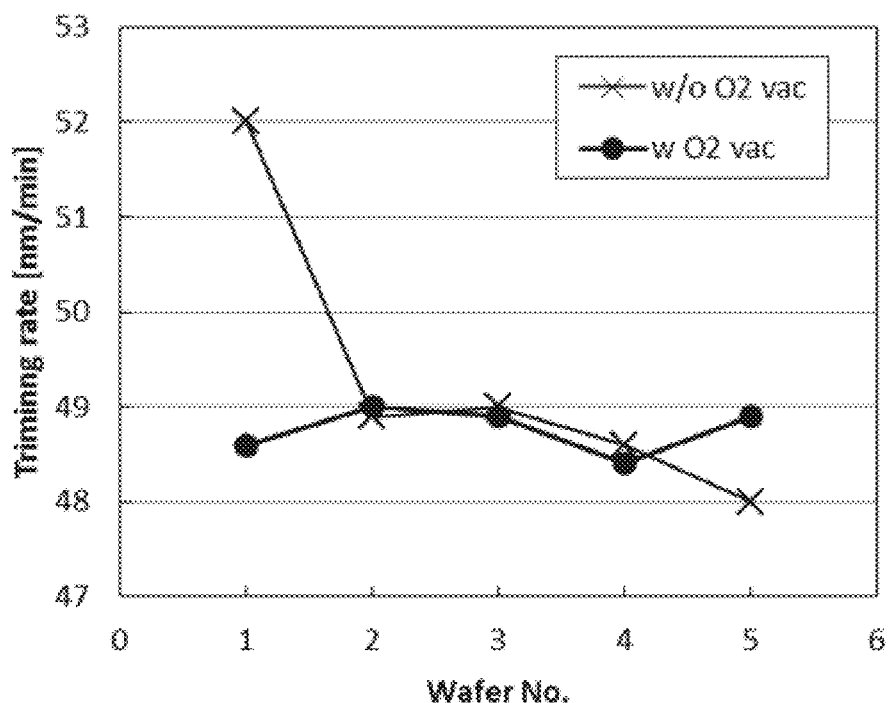
FIG. 10 is a graph showing the relationship between trimming rate [nm/min] and the order of wafers when evacuation of oxygen supply line is conducted ("w O2 vac") and is not conducted ("w/o O2 vac") according to an embodiment of the present invention.

The results are shown in FIG. 10. FIG. 10 is a graph showing the relationship between trimming rate [nm/min] and the order of wafers when evacuation of oxygen supply line is conducted ("w O2 vac") and is not conducted ("w/o O2 vac") according to Examples 37 and 38. As shown in FIG. 10, when no evacuation was conducted, the trimming rate of the first wafer was significantly higher than that of the second or subsequent wafers. This may be because oxygen gas moved into the supply line during an idling period (i.e., a period between a deposition session of prior wafers and a trimming session of next wafers), adding extra oxygen gas to the trimming gas. By evacuating the oxygen gas supply line before staring the trimming process, an increase of the trimming rate can be inhibited.

Examples 39 to 41

Examples 39 to 41 were conducted in a manner substantially similar to that in Examples 1 to 6 under conditions shown in Table 9 below. In these examples, the duration of step 1 (oxygen-free RF power) in FIG. 3 was changed, i.e., not only step 1-1 (spike RF power) but also step 1-2 (oxygen-free plasma treatment) were conducted at the same oxygen-free RF power.

TABLE 9

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 39 | 60 | 6000 | — | 200 | 13 | 75 | — | — | 0.5 | 150 | 0.1 | 60 | — | 8 | Ar: 500 |
| 40 | 60 | 6000 | — | 200 | 13 | 75 | — | — | 8 | 150 | 0.1 | 60 | — | 8 | Ar: 500 |
| 41 | 60 | 6000 | — | 200 | 13 | 75 | — | — | 15 | 150 | 0.1 | 60 | — | 8 | Ar: 500 |

Figure 11:
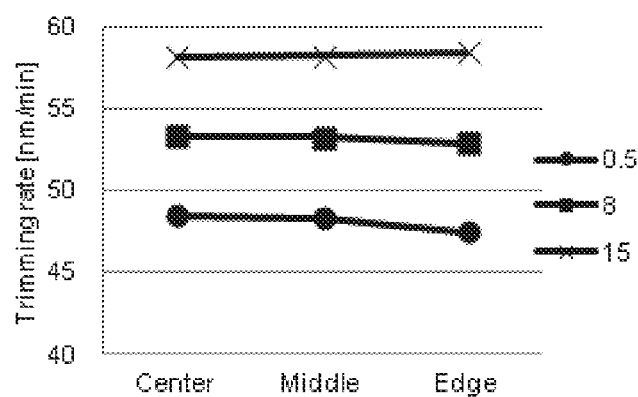
FIG. 11 is a graph showing trimming rate [nm/min] at different locations of a wafer according to an embodiment of the present invention.
Figure 12:
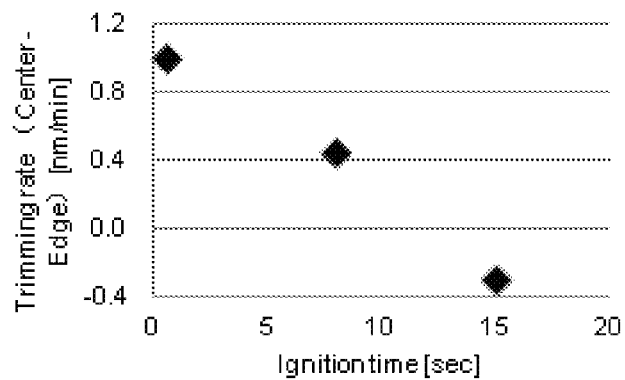
FIG. 12 is a graph showing the relationship between trimming rate in-plane uniformity (a difference between trimming rate at the center and trimming rate at the edge) [nm/min] and time period [sec] of oxygen-free RF power according to an embodiment of the present invention.

The results are shown in FIGS. 11 and 12. FIG. 11 is a graph showing trimming rate [nm/min] at different locations of a wafer according to Examples 39 to 41. FIG. 12 is a graph showing the relationship between trimming rate in-plane uniformity (a difference between trimming rate at the center and trimming rate at the edge) [nm/min] and time period [sec] of oxygen-free RF power according to Examples 39 to 41. As shown in FIGS. 11 and 12, when the duration of oxygen-free RF power application was increased, the trimming rate increased at the center, in the middle, and near the edge (FIG. 11); however, in-plane trimming uniformity was significantly improved (FIG. 12). A duration of oxygen-free RF power application of about 8 seconds to about 12 seconds is expected to be highly effective.

Examples 42 to 45

Examples 42 to 45 were conducted on trimmed photoresist under conditions shown in Table 10 below. In these examples, RF power was applied to the trimmed photoresist in a manner similar to step 1 (oxygen-free RF power application) in FIG. 3, and then a SiO film was deposited as a spacer.

TABLE 10

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 42 | — | — | — | 200 | 13 | 75 | — | — | 0.5 | 150 | — | — | — | — | Ar: 500 |
| 43 | — | — | — | 200 | 13 | 75 | — | — | 5 | 150 | — | — | — | — | Ar: 500 |
| 44 | — | — | — | 200 | 13 | 75 | — | — | 10 | 150 | — | — | — | — | Ar: 500 |
| 45 | — | — | — | 200 | 13 | 75 | — | — | 15 | 150 | — | — | — | — | Ar: 500 |

Figure 13:
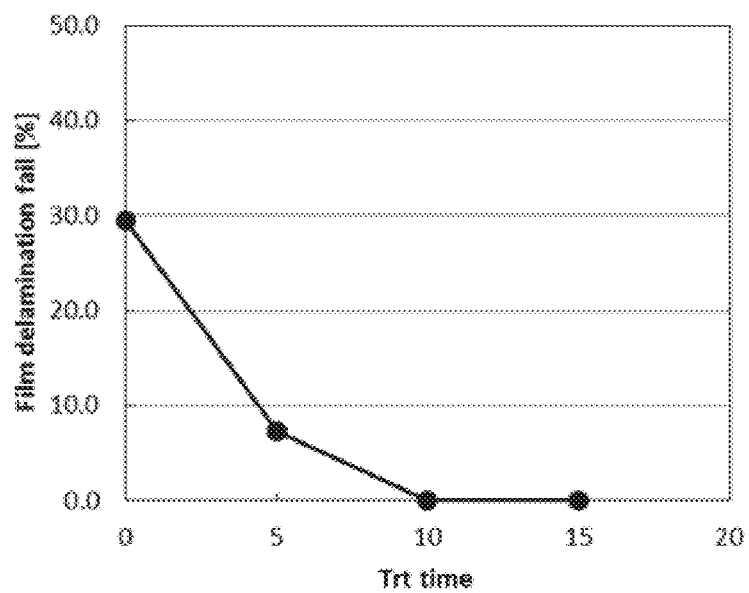
FIG. 13 is a graph showing the relationship between film delamination ratio [%] and time period [sec] of oxygen-free RF power according to an embodiment of the present invention.

In these examples, after the trimming was complete, a SiO film was deposited by plasma-enhanced atomic layer deposition (PEALD), and the surface was observed with a SEM (scanning electron microscope) to see if the SiO film was peeled (film delamination). FIG. 13 is a graph showing the relationship between film delamination ratio [%] and time period [sec] of RF power treatment ("Trt time") according to Examples 42 to 45. The film delamination ratio [%] refers to percentage of lattices which showed separation of the SiO film relative to the 68 lattices in total included in a square area of 3 cm×3 cm of the substrate. As shown in FIG. 13, by conducting the oxygen-free RF power application, film delamination can completely be prevented. A duration of RF power treatment of about 8 seconds to about 12 seconds is expected to be highly effective.

Examples 46 to 48

Examples 46 to 48 were conducted in a manner substantially similar to that in Examples 1 to 6 under conditions shown in Table 11 below.

TABLE 11

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 46 | 60 | 6000 | — | 200 | 13 | 50 | — | — | 0.5 | 150 | 0.1 | 60 | — | 8 | Ar: 500 |
| 47 | 60 | 6000 | — | 200 | 13 | 75 | — | — | 0.5 | 150 | 0.1 | 60 | — | 8 | Ar: 500 |
| 48 | 60 | 6000 | — | 200 | 13 | 100 | — | — | 0.5 | 150 | 0.1 | 60 | — | 8 | Ar: 500 |

Figure 15:
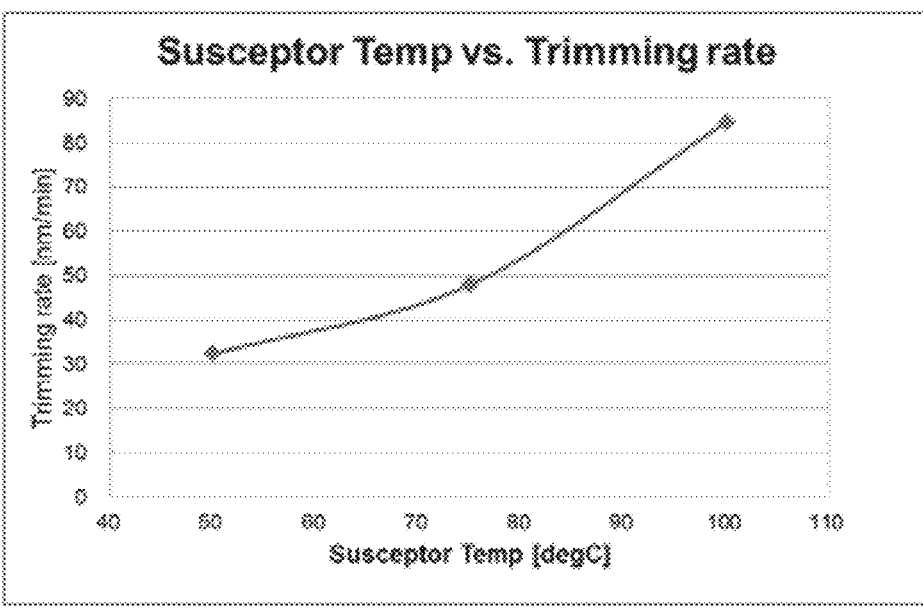
FIG. 15 is a graph showing the relationship between trimming rate [nm/min] and susceptor temperature [° C.] according to an embodiment of the present invention.
Figure 16:
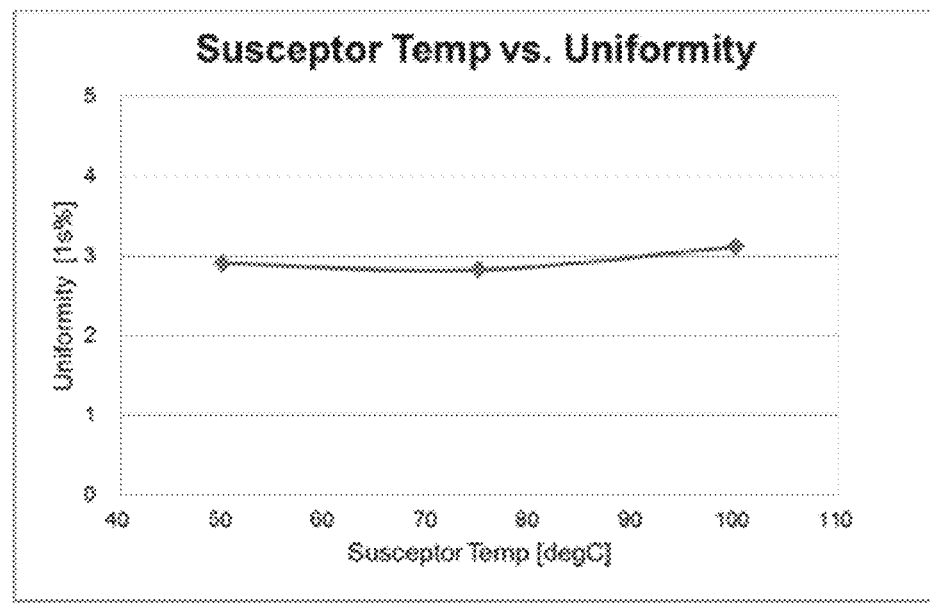
FIG. 16 is a graph showing the relationship between etch uniformity [1σ%] and susceptor temperature [° C.] according to an embodiment of the present invention.

The results are shown in FIGS. 15 and 16. FIG. 15 is a graph showing the relationship between trimming rate [nm/min] and susceptor temperature [° C.] according to Examples 46 to 48. FIG. 16 is a graph showing the relationship between etch uniformity [1σ %] and susceptor temperature [° C.] according to Examples 46 to 48. As shown in FIGS. 15 and 16, by decreasing the susceptor temperature to lower than 85° C., the trimming rate can be reduced to 55 nm/min or less without degrading the in-plane trimming uniformity.

As illustrated in Examples 46 to 48, by lowering the susceptor temperature, the trimming rate can be reduced. However, low-temperature trimming may degrade the quality of a spacer film deposited on the core material (photoresist). Thus, when depositing a spacer film, the susceptor temperature can be increased. The temperature control can be accomplished by using a heating element, using a combination of a heating element and a cooling gas channel, using a system provided also with liquid flow, or a heat exchanging device with a heat exchange medium, which are embedded in the susceptor.

Examples 49 to 60

Examples 49 to 60 were conducted in a manner substantially similar to that in Examples 1 to 6 under conditions shown in Table 12 below. In these examples, pre-baking was conducted prior to the trimming process.

TABLE 12

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 49 | — | — | — | 400 | 13 | 80 | 80 | 30 | — | — | — | — | — | — | Ar: 2000 |
| 50 | — | — | — | 400 | 13 | 80 | 80 | 60 | — | — | — | — | — | — | Ar: 2000 |
| 51 | — | — | — | 400 | 13 | 80 | 80 | 90 | — | — | — | — | — | — | Ar: 2000 |
| 52 | — | — | — | 400 | 13 | 80 | 100 | 30 | — | — | — | — | — | — | Ar: 2000 |
| 53 | — | — | — | 400 | 13 | 80 | 100 | 60 | — | — | — | — | — | — | Ar: 2000 |
| 54 | — | — | — | 400 | 13 | 80 | 100 | 90 | — | — | — | — | — | — | Ar: 2000 |
| 55 | — | — | — | 400 | 13 | 80 | 120 | 30 | — | — | — | — | — | — | Ar: 2000 |
| 56 | — | — | — | 400 | 13 | 80 | 120 | 60 | — | — | — | — | — | — | Ar: 2000 |
| 57 | — | — | — | 400 | 13 | 80 | 120 | 90 | — | — | — | — | — | — | Ar: 2000 |
| 58 | — | — | — | 400 | 13 | 80 | 140 | 30 | — | — | — | — | — | — | Ar: 2000 |
| 59 | — | — | — | 400 | 13 | 80 | 140 | 60 | — | — | — | — | — | — | Ar: 2000 |
| 60 | — | — | — | 400 | 13 | 80 | 140 | 90 | — | — | — | — | — | — | Ar: 2000 |

The results are shown in Table 13 below.

TABLE 13

| | | Time [sec.] | | |
|---|---|---|---|---|
| Gas: Ar | | 30 | 60 | 90 |
| Template(P.R.) shape degradation | | | | |
| Temperature | 80 | None (Ex. 49) | None (Ex. 50) | None (Ex. 51) |
| | 100 | None (Ex. 52) | None (Ex. 53) | None (Ex. 54) |
| | 120 | None (Ex. 55) | None (Ex. 56) | Observed (Ex. 57) |
| | 140 | Observed (Ex. 58) | Observed (Ex. 59) | Observed (Ex. 60) |
| Film Peeling | | | | |
| Temperature | 80 | 22.1% (Ex. 49) | 4.4% (Ex. 50) | 0% (Ex. 51) |
| | 100 | 0% (Ex. 52) | 0% (Ex. 53) | 0% (Ex. 54) |
| | 120 | 0% (Ex. 55) | 0% (Ex. 56) | 0% (Ex. 57) |
| | 140 | 0% (Ex. 58) | 0% (Ex. 59) | 0% (Ex. 60) |

As shown in Table 13, by increasing the susceptor temperature to 100° C. or higher for pre-baking, film peeling can be prevented (Examples 51 to 60). This may be because residual volatile components and absorbed moisture can be removed from the core material prior to the trimming, thereby improving adhesion. However, when the susceptor temperature was 120° C. or higher, the shape and dimensions of the core material were partially degraded (Examples 57 to 60). This may be because the pre-baking temperature became close to the glass transition temperature of the core material, softening the core material, or the degassing occurred too fast. A pre-baking temperature of about 100° C. and about 120° C. is expected to be highly effective in this particular model, but the optimal pre-baking temperature varies depending upon the upper limit of heat resistance of the photoresist and is preferably set about 10° C. lower than the upper limit of heat resistance of the photoresist.

The pre-baking can be conducted not only prior to the trimming, but also after the trimming, so that a newly exposed surface of the core material by the trimming can be treated, promoting degassing from the newly exposed surface, prior to spacer deposition. Thus, it is effective to change the susceptor temperature at the pre-baking step, the trimming step, and the spacer deposition step.

Example 61

Example 61 was conducted in a manner substantially similar to that in Examples 1 to 6 under conditions shown in Table 14 below. In this example, ignition stability was determined in relation to RF power.

TABLE 14

| Ex. | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| 61 | 50-200 | 6000 | — | 200 | 13 | 75 | — | — | — | — | — | — | — | — | Ar: 500 |

Figure 7:
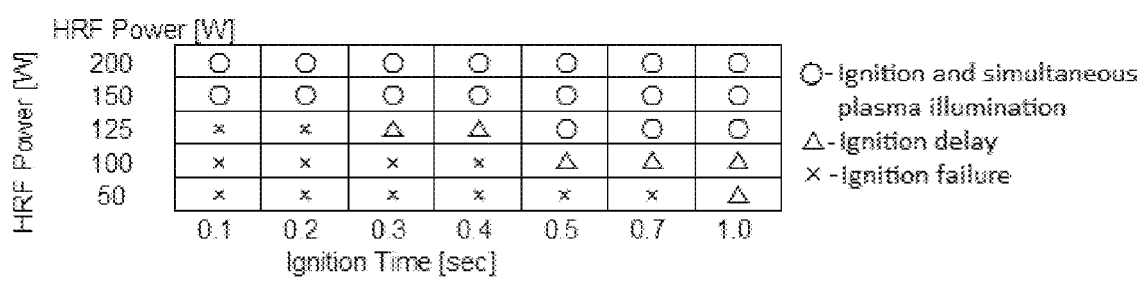
FIG. 7 is a table showing ignition status in relation to ignition power [W] and ignition time [sec] according to an embodiment of the present invention.

The results are shown in FIG. 7. FIG. 7 is a table showing ignition status in relation to ignition power [W] and ignition time [sec] according to Example 61. As shown in FIG. 7, when RF power was less than 125 W, it required extended time to ignite a plasma or ignition did not start, and plasma illumination, if any, was delayed. When RF power was 150 W or higher, ignition started and simultaneously plasma illumination was observed. Thus, in step 1 of FIG. 3, the spike RF power is preferably 125 W or higher, more preferably 150 W or higher.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for trimming a carbon-containing film, comprising:
   (i) providing a substrate having a carbon-containing film formed thereon in a reaction space wherein the substrate is placed between electrodes;
   (ii) supplying a trimming gas and a rare gas to the reaction space, said trimming gas comprising an oxygen-containing gas; and
   (iii) applying RF power between the electrodes to generate a plasma using the trimming gas and the rare gas in the reaction space, to thereby trim the carbon-containing film while controlling a trimming rate at 55 nm/min or less as a function of at least one parameter selected from the group consisting of a flow rate of the oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed,
   said method further comprising, prior to step (ii):
   (a) supplying a rare gas to the reaction space; and
   (b) applying RF power between the electrodes to generate a plasma using the rare gas, said RF power being higher than the RF power applied in step (iii), followed by step (ii) without stopping application of RF power.

2. The method according to claim 1, wherein the at least one parameter is RF power wherein the trimming rate is controlled at 55 nm/min or less by controlling RF power applied between the electrodes at less than about 0.113 W per $cm^2$ of the substrate.

3. The method according to claim 2, wherein RF power applied between the electrodes is more than about 0.071 W per $cm^2$ of the substrate.

4. The method according to claim 1, wherein the at least one parameter is a flow rate of the nitrogen-containing gas to be added to the oxygen-containing gas wherein the trimming rate is controlled at 55 nm/min or less by adding the nitrogen-containing gas to the oxygen-containing gas at a flow rate of more than zero.

5. The method according to claim 1, wherein the oxygen-containing gas is $CO_2$, and the at least one parameter is a flow rate of the oxygen-containing gas wherein the trimming rate is controlled at 55 nm/min or less by controlling the flow rate of the oxygen-containing gas at more than 500 sccm.

6. The method according to claim 1, wherein the oxygen-containing gas is $O_2$, and the at least one parameter is a flow rate of the oxygen-containing gas wherein the trimming rate is controlled at 55 nm/min or less by controlling the flow rate of the oxygen-containing gas at more than 1,000 sccm.

7. The method according to claim 1, wherein the at least one parameter is pressure in the reaction space wherein the trimming rate is controlled at 55 nm/min or less by controlling the pressure at less than 300 Pa.

8. The method according to claim 1, wherein the at least one parameter is the gap between the electrodes wherein the trimming rate is controlled at 55 nm/min or less by controlling the gap at at least about 10 mm.

9. The method according to claim 1, wherein the at least one parameter is the temperature of the susceptor wherein the trimming rate is controlled at 55 nm/min or less by controlling the temperature at lower than 85° C.

10. The method according to claim 1, wherein the RF power applied in step (b) is at least about 0.141 W per $cm^2$ of the substrate.

11. The method according to claim 1, further comprising, prior to step (b), evacuating a gas line through which the oxygen-containing gas flows to the reaction space.

12. The method according to claim 1, further comprising, after step (b) but before step (ii), applying RF power between the electrodes at a power which is between the RF power applied in step (b) and the RF power applied in step (iii).

13. The method according to claim 12, wherein a duration of applying RF power between steps (b) and (ii) is about 10 seconds or less.

14. The method according to claim 9, further comprising, prior to step (ii), pre-baking the carbon-containing film at a susceptor temperature which is higher than that in step (iii).

15. The method according to claim 14, wherein the susceptor temperature is about 10° C. lower than the upper limit of heat resistance temperature of the carbon-containing film.

16. The method according to claim 1, wherein the carbon-containing film is a patterned photoresist.

17. The method according to claim 16, further comprising, after step (iii), depositing a silicon oxide film on the trimmed patterned photoresist in the reaction space.

18. A method for trimming a carbon-containing film, comprising:
   (i) providing a substrate having a carbon-containing film formed thereon in a reaction space wherein the substrate is placed between electrodes;
   (ii) supplying a halogen-free trimming gas and a rare gas to the reaction space, said trimming gas comprising an oxygen-containing gas and a nitrogen-containing gas, wherein all the oxygen-containing gas included in the trimming gas is selected from the group consisting of $O_2$, $O_3$, NO, $N_2O$, $NO_2$, and $CO_2$; and
   (iii) applying RF power between the electrodes to generate a plasma using the trimming gas and the rare gas in the reaction space, to thereby trim the carbon-containing film while controlling a trimming rate at about 40 nm/min or less as a function of at least one parameter selected from the group consisting of a flow rate of the oxygen-containing gas, a flow rate of the nitrogen-containing gas to be added to the oxygen-containing gas, pressure in the reaction space, RF power, a duty cycle of RF power, a distance between the electrodes, and a temperature of a susceptor on which the substrate is placed,
   wherein the at least one parameter is a flow rate of the nitrogen-containing gas to be added to the oxygen-containing gas wherein the trimming rate is controlled at about 40 nm/min or less by adding the nitrogen-containing gas to the oxygen-containing gas at a flow rate of more than zero, wherein the flow rate of the nitrogen-containing gas is higher than the flow rate of the oxygen-containing gas, wherein a pressure of the reaction space is at least 100 Pa.

19. A method for trimming a carbon-containing film, comprising:
  (i) providing a substrate having a carbon-containing film formed thereon in a reaction space wherein the substrate is placed between electrodes;
  (ii) supplying a trimming gas and a rare gas to the reaction space, said trimming gas comprising an oxygen-containing gas; and
  (iii) applying RF power between the electrodes to generate a plasma using the trimming gas and the rare gas in the reaction space, to thereby trim the carbon-containing film while controlling a trimming rate at about 40 nm/min or less as a function of at least one parameter selected from the group consisting of a flow rate of the oxygen-containing gas, a flow rate of nitrogen-containing gas to be added to the oxygen-containing gas, pressure in the reaction space, RF power, a duty cycle of RF power, a distance between the electrodes, and a temperature of a susceptor on which the substrate is placed,
  wherein RF power is applied in pulses, and the at least one parameter is a duty cycle of RF power wherein the trimming rate is controlled at about 40 nm/min or less by controlling the duty cycle of RF power at less than 100%, said duty cycle being defined as a ratio between a pulse duration of RF power and a cycle duration of pulses of RF power, wherein RF power is switched on and off to form a pulse train of RF power, and a frequency of the on and off cycles is about 100 Hz.

* * * * *